United States Patent
Kim et al.

(10) Patent No.: US 11,091,696 B2
(45) Date of Patent: Aug. 17, 2021

(54) ETCHING COMPOSITION AND METHOD FOR MANUFACTURING SEMICONDUCTOR DEVICE USING THE SAME

(71) Applicants: Samsung Electronics Co., Ltd., Suwon-si (KR); Soulbrain Co., Ltd., Seongnam-si (KR)

(72) Inventors: Yongtae Kim, Seongnam-si (KR); Junghun Lim, Seongnam-si (KR); Soojin Kim, Seoul (KR); Jung-Min Oh, Incheon (KR); Seungmin Jeon, Suwon-si (KR); Hayoung Jeon, Hwaseong-si (KR)

(73) Assignees: SAMSUNG ELECTRONICS CO., LTD., Suwon-si (KR); Soulbrain Co., Ltd., Seongnam-si (KR)

(*) Notice: Subject to any disclaimer, the term of this patent is extended or adjusted under 35 U.S.C. 154(b) by 0 days.

(21) Appl. No.: 16/387,892

(22) Filed: Apr. 18, 2019

(65) Prior Publication Data
US 2020/0079999 A1 Mar. 12, 2020

(30) Foreign Application Priority Data
Sep. 7, 2018 (KR) .................. 10-2018-0107126

(51) Int. Cl.
| | | |
|---|---|---|
| C09K 13/08 | (2006.01) | |
| H01L 21/02 | (2006.01) | |
| H01L 21/306 | (2006.01) | |
| H01L 29/786 | (2006.01) | |
| H01L 29/66 | (2006.01) | |
| H01L 29/06 | (2006.01) | |
| H01L 29/423 | (2006.01) | |

(52) U.S. Cl.
CPC ........ *C09K 13/08* (2013.01); *H01L 21/02532* (2013.01); *H01L 21/02603* (2013.01); *H01L 21/30604* (2013.01); *H01L 29/0673* (2013.01); *H01L 29/42392* (2013.01); *H01L 29/66545* (2013.01); *H01L 29/66742* (2013.01); *H01L 29/78696* (2013.01)

(58) Field of Classification Search
None
See application file for complete search history.

(56) References Cited

U.S. PATENT DOCUMENTS

| | | |
|---|---|---|
| 6,689,540 B2 | 2/2004 | Aviram et al. |
| 7,176,041 B2 | 2/2007 | Lee et al. |
| 7,709,277 B2 | 5/2010 | Lee et al. |
| 7,776,745 B2 | 8/2010 | Loubet et al. |
| 8,778,210 B2 | 7/2014 | Cooper et al. |
| 9,881,803 B2 | 1/2018 | Hsu et al. |

(Continued)

FOREIGN PATENT DOCUMENTS

| | | |
|---|---|---|
| KR | 1991-0006458 A | 4/1991 |
| KR | 100475462 B1 | 3/2005 |

(Continued)

*Primary Examiner* — Roberts P. Culbert
(74) *Attorney, Agent, or Firm* — Muir Patent Law, PLLC

(57) ABSTRACT

Provided are an etching composition and a method for manufacturing a semiconductor device using the same. According to embodiments, the etching composition may comprise from about 15 wt % to about 75 wt % of peracetic acid; a fluorine compound; an amine compound; and an organic solvent.

15 Claims, 10 Drawing Sheets

(56) References Cited

U.S. PATENT DOCUMENTS

| | | | |
|---|---|---|---|
| 2004/0242015 A1 | 12/2004 | Kim et al. | |
| 2007/0111474 A1 | 5/2007 | Delattre et al. | |
| 2018/0163130 A1* | 6/2018 | Kim | H01L 29/78 |
| 2018/0197746 A1* | 7/2018 | Bilodeau | C09K 13/08 |
| 2019/0088492 A1* | 3/2019 | Liu | H01L 21/0245 |

FOREIGN PATENT DOCUMENTS

| | | |
|---|---|---|
| KR | 20170034036 A | 3/2017 |
| KR | 20180068591 A | 6/2018 |

* cited by examiner

ETCHING COMPOSITION AND METHOD FOR MANUFACTURING SEMICONDUCTOR DEVICE USING THE SAME

CROSS-REFERENCE TO RELATED APPLICATIONS

This U.S. non-provisional patent application claims the benefit of priority under 35 U.S.C. § 119 of Korean Patent Application No. 10-2018-0107126, filed on Sep. 7, 2018, the entire contents of which are hereby incorporated by reference.

BACKGROUND

The present disclosure herein relates to an etching composition and a method for manufacturing a semiconductor device using the same, and more particularly, to an etching composition used for etching a semiconductor layer and a method for manufacturing a semiconductor device using the same.

In order to provide high performance and low cost, which is required by consumers, the increase of the integration degree and the improvement of reliability of semiconductor devices are required. With the increase of the integration degree of semiconductor devices, damages of the constituent elements of a semiconductor device during the manufacturing process of the semiconductor device influence more to the reliability and electrical properties of a semiconductor memory device. Particularly, during the manufacturing process of the semiconductor device, the keeping of the high etching selectivity of an etching target layer material with respect to other layer materials is required.

SUMMARY

The present disclosure provides an etching composition having high etching selectivity with respect to a germanium-containing layer.

The present disclosure also provides a method for manufacturing a semiconductor device having improved electrical properties.

According to some example embodiments, the disclosure is directed to an etching composition, comprising: from about 15 wt % to about 75 wt % of peracetic acid; a fluorine compound; an amine compound; and an organic solvent.

According to some example embodiments, the disclosure is directed to an etching composition comprising: peracetic acid; a fluorine compound; from about 0.01 wt % to about 5 wt % of an amine compound; and an organic solvent.

According to some example embodiments, the disclosure is directed to a method for manufacturing a semiconductor device, the method comprising: preparing a substrate which is provided with a germanium-containing layer; and performing an etching process using an etching composition on the germanium-containing layer, to remove the germanium-containing layer, wherein the etching composition comprises: from about 15 wt % to about 75 wt % of peracetic acid; a fluorine compound; an amine compound; and an organic solvent.

BRIEF DESCRIPTION OF THE FIGURES

The accompanying drawings are included to provide a further understanding of the inventive concepts, and are incorporated in and constitute a part of this specification. The drawings illustrate exemplary embodiments of the inventive concept and, together with the description, serve to explain principles of the inventive concepts. In the drawings.

DETAILED DESCRIPTION

In the disclosure, "substituted or unsubstituted" may mean substituted or unsubstituted with at least one substituent selected from the group consisting of a hydrogen atom, a deuterium atom, a halogen atom, cycloalkyl, aryl, heteroaryl, heteroalicyclic, hydroxyl, alkoxy, aryloxy, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfoneamide, N-sulfoneamide, C-carboxy, O-carboxy, isocyanato, thiocyanato, isothiocyanato, nitro, silyl, trihalomethanesulfonyl, amino including mono- and di-substituted amino groups, and the derivatives thereof. In addition, each of the substituents may be substituted or unsubstituted. For example, a methylamino group may be substituted with an amino group.

In the disclosure, an alkyl group may be a linear alkyl group, a branched alkyl group or a cyclic alkyl group. The carbon number of the alkyl group is not specifically limited, but may be an alkyl group of 1 to 12 carbon atoms.

In the disclosure, the carbon number of the amine/amino group is not specifically limited, but may be 1 to 12. Amine may include at least one among an aliphatic amine of 1 to 12 carbon atoms, and a cyclic amine of 5 to 12 carbon atoms.

Hereinafter, an etching example composition according to the inventive concept will be explained.

According to the inventive concept, an example etching composition may include peracetic acid ($CH_3COOOH$), a fluorine compound, an amine compound and an organic solvent. The etching composition may be used for etching a semiconductor layer. The semiconductor layer may be a germanium-containing layer. The germanium-containing layer may include, for example, silicone-germanium. In the present disclosure, etching a certain layer material may mean removing a material constituting the layer material. Hereinafter, the etching composition and an etching process using the same will be explained referring to FIGS. 1A and 1B.

Figure 1A:
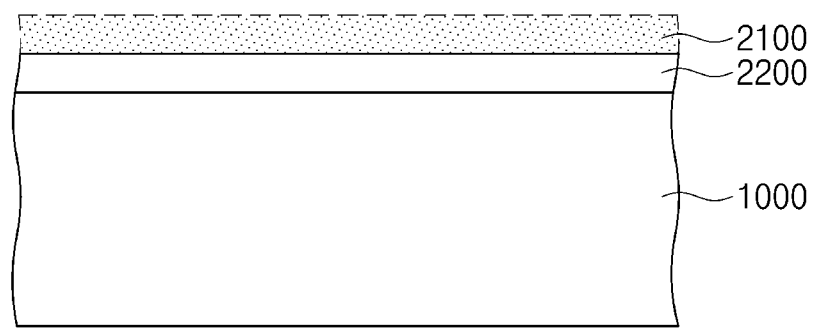
FIG. 1A is a diagram for explaining an etching process using an etching composition according to example embodiments.
Figure 1B:
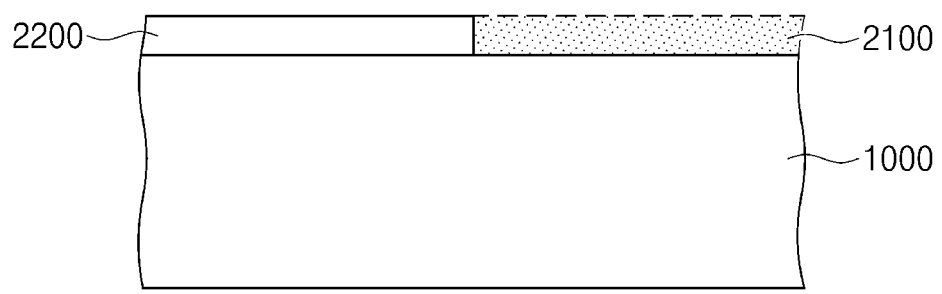
FIG. 1B is a diagram for explaining an etching process using an etching composition according to example embodiments.

FIG. 1A is a diagram for explaining an etching process using an etching composition according to example embodiments. FIG. 1B is a diagram for explaining an etching process using an etching composition according to example embodiments.

Referring to FIGS. 1A and 1B, a germanium-containing layer 2100 and a silicon-containing layer 2200 may be provided on a base substrate 1000. The germanium-containing layer 2100 may further include silicon (Si). For example, the germanium-containing layer 2100 may include silicon-germanium. The silicon-containing layer 2200 may include silicon, silicon oxide, silicon nitride, and/or silicon oxycarbonitride (SiOCN). The silicon-containing layer 2200 may include, for example, polysilicon. In description below, the germanium-containing layer 2100 is a silicon-germanium layer, and the silicon-containing layer 2200 is a silicon layer or a silicon oxide layer, but an embodiment of the inventive concept is not limited thereto. As shown in FIG. 1A, the germanium-containing layer 2100 may be stacked on an upper surface of the silicon-containing layer 2200. As shown in FIG. 1B, the germanium-containing layer 2100 may be disposed at one side of the silicon-containing layer 2200. In another embodiment, the silicon-containing layer 2200 may be stacked on an upper surface of the germanium-containing layer 2100.

An etching composition may be supplied on the germanium-containing layer 2100 and the silicon-containing layer 2200, and the germanium-containing layer 2100 may be etched as shown by dotted lines. In the etching process using the etching composition, the germanium-containing layer 2100 may have high etching selectivity with respect to the silicon-containing layer 2200. For example, in the etching process using the etching composition, the etching rate of silicon-germanium may be greater than the etching rate of silicon. Accordingly, after the etching process, the germanium-containing layer 2100 may be removed, but the silicon-containing layer 2200 may not be removed and may remain. The etching rate of a certain constituent element may be defined as the volume change of the constituent element according to etching process time.

The etching of the germanium-containing layer 2100 may include oxidizing silicon-germanium to form a semiconductor oxide, reacting the semiconductor oxide to form a water-soluble product, and removing the water-soluble product.

According to example embodiments, peracetic acid may be provided. The peracetic acid may be dissolved in water. The germanium-containing layer 2100 may be oxidized by the peracetic acid to form a semiconductor oxide. The semiconductor oxide may include silicon oxide (for example, SiOx) and germanium oxide (for example, GeOy). (Here, each of x and y may be a positive rational number, independently of one another. For example, x may be 2 and y may be 2.) For example, the peracetic acid may make contact with silicon-germanium (SiGe) to cleave the bond between silicon (Si) and germanium (Ge), thereby forming silicon oxide and germanium oxide.

The peracetic acid may be from about 15 wt % to about 75 wt % of the etching composition. If the composition ratio of the peracetic acid is less than about 15 wt %, the oxidation of silicon-germanium may be insufficient. Due to this, the etching rate of the germanium-containing layer 2100 may be low. If the composition ratio of the peracetic acid is greater than about 75 wt %, the removing rate of silicon-germanium may decrease. According to example embodiments, when a content of the peracetic acid ranges from about 15 wt % to about 75 wt % of the etching composition, the etching rate of the germanium-containing layer 2100 may be high.

The peracetic acid may be prepared from acetic acid ($CH_3COOH$) and hydrogen peroxide ($H_2O_2$). The acetic acid and the hydrogen peroxide may be mixed in a volume ratio in a range from 33:20 to 33:30. In an embodiment, hydrogen peroxide may be hydrogen peroxide included in an aqueous hydrogen peroxide solution, which contains about 31 mass percent (%) of hydrogen peroxide, and acetic acid may be an aqueous acetic acid solution, which contains about 100 mass percent of acetic acid. By the mixing of acetic acid and hydrogen peroxide, a peracetic acid mixture may be obtained. The peracetic acid mixture may include peracetic acid, acetic acid, and hydrogen peroxide. The peracetic acid may be produced by the reaction of acetic acid and hydrogen peroxide. The acetic acid in the peracetic acid mixture may correspond to acetic acid remaining after the reaction. The hydrogen peroxide in the peracetic acid mixture may correspond to hydrogen peroxide remaining after the reaction. During preparing the peracetic acid mixture, an aging catalyst may be further used. The volume ratio of the acetic acid and the aging catalyst may be in a range from 33:0.1 to 33:10. In some embodiments, the volume ratio of the acetic acid and the aging catalyst may be in a range from 33:1 to 33:2. The aging catalyst may include at least one among sulfuric acid and methansulfonic acid. In an embodiment, about 95 mass percent of sulfuric acid may be used as the aging catalyst. By using the aging catalyst, peracetic acid may be prepared more quickly. The aging catalyst may remain in the etching composition. The peracetic acid may be from about 40 wt % to about 60 wt % of the peracetic acid mixture, but an embodiment of the inventive concept is not limited thereto.

The fluorine compound may include, for example, at least one selected from the group consisting of hydrogen fluoride (HF), sodium fluoride (NaF), potassium fluoride (KF), aluminum difluoride ($AlF_2$), lithium fluoride ($LiF_4$), calcium trifluoride (CaF3), sodium hydrogen hexafluoride ($NaHF_6$), ammonium fluoride ($NH_4F$), ammonium difluoride ($NH_4HF_2$), tetramethylammonium fluoride (($CH_3)_4NF$), potassium hydrogen difluoride ($KHF_2$), tetrafluoroboric acid ($HBF_4$), ammonium tetrafluoroborate ($NH_4BF_4$), potassium tetrafluoroborate ($KBF_4$) and fluorosilicic acid ($H_2SiF_6$).

The fluorine compound may provide fluoride anions in an etching process. The fluoride anion may include, for example, $F^-$, HF and $HF^{2-}$. The fluoride anion may react with silicon oxide and germanium oxide, which are produced by peracetic acid, to produce a water-soluble product. The water-soluble product may include $H_2SiF_6$, $(NH_4)_2SiF_6$, $H_2GeF_6$, and/or $(NH_4)_2GeF_6$. For example, the fluorine compound may react with silicon oxide to form $H_2SiF_6$ or $(NH_4)_2SiF_6$. The fluorine compound may react with germanium oxide to form $H_2GeF_6$ or $(NH_4)_2GeF_6$.

The fluorine compound content may be from about 0.01 wt % to about 5 wt % of the etching composition. If the content of the fluorine compound is less than about 0.01 wt %, the fluorine compound may be insufficient to remove silicon oxide and germanium oxide, which are produced by peracetic acid. Accordingly, the etching rate of the germanium-containing layer 2100 may decrease. If the composition ratio of the fluorine compound content is greater than about 5 wt %, the etching composition may have the high etching rate of the silicon-containing layer 2200 as well as the high etching rate of the germanium-containing layer 2100. In this case, the etching selectivity of the germanium-containing layer 2100 with respect to the silicon-containing layer 2200 may decrease. According to embodiments, since the content ratio of the fluorine compound is from about 0.01 wt % to about 5 wt %, the etching composition may have the high etching rate of the germanium-containing layer 2100 and may have the high etching selectivity of the silicon-germanium layer (e.g., the germanium-containing layer 2100) with respect to the silicon-containing layer 2200.

The amine compound may include at least one among an aliphatic amine and a cyclic amine. The carbon number of the aliphatic amine may be 1 to 12, or more particularly, 1 to 5. Here, the aliphatic group may be saturated hydrocarbon or unsaturated hydrocarbon. The aliphatic group may be linear or branched hydrocarbon. The amine compound may include diamine. The carbon number of the cyclic amine may be 5 to 12. The cyclic amine may include a hetero aromatic amine, but an embodiment of the inventive concept is not limited thereto. The amine compound may be a primary amine, a secondary amine, or a tertiary amine. The amine compound may include at least one selected among pyridine, 2-pyridinamine, 2-pyridinethiol, 4-pyridinol, 2-picoline, 4-picoline, 8-hydroxyquinoline, picolinic acid, picolinic acid N-oxide, piperidine, 4-methylpiperidine, methylamine, ethylamine, propylamine, octylamine, 1,1,3,3-tetramethylbutylamine, diethanolamine, diisopropylamine, nicotinamine, pyrrolidine, 2,2A-bipyridine, pyrazole, L-proline, pyridazine, triethylamine, triethanolamine, ethylenediamine, 1,3-diaminopropane, 1,4-diaminobutane, 1,6-diaminohexane, 1,8-diaminooctane, dimethylamine, diethylamine, triethylenetetramine, tetraethylenepentamine, N,N-dimethyl-1,3-propanediamine, N,N,NA,NA-tetramethyl-1,3-propanediamine, N,N,NA,NA-tetraethylenediamine, 1,1,3,3-tetramethylguanidine, N,N,NA,NA-tetrakis(2-hydroxyethyl)ethlenediamine, urea, N-allylthiourea, and tris(2-aminoethyl)amine).

The amine compound may play a role of an etch booster. For example, the amine compound may increase the etching selectivity of a silicon-germanium layer with respect to a silicon layer. The amine compound may be adsorbed on semiconductor oxide that is formed during an etching process. For example, the amine compound may be adsorbed on silicon oxide and germanium oxide. The amine compound-adsorbed silicon oxide and the amine compound-adsorbed germanium oxide may react with fluorine ions more easily and quickly. Accordingly, the amine compound may assist the removal of silicon oxide and/or germanium oxide.

The amine compound content may be from about 0.01 wt % to about 5 wt % of the etching composition. If the content of the amine compound is less than about 0.01 wt %, the amine compound may be inadequate to adsorb silicon oxide and germanium oxide. Accordingly, the etching rate of the germanium-containing layer 2100 may decrease. If the content of the amine compound is greater than about 5 wt %, the etching rate of the silicon-containing layer 2200 may increase, as will the etching rate of the germanium-containing layer 2100. For example, the etching rates of silicon-germanium, silicon and silicon oxide may increase. Accordingly, the etching selectivity of the germanium-containing layer 2100 may decrease.

The organic solvent may include at least one compound selected among an alcohol compound, a carboxylic acid compound, and an acetate compound. The alcohol compound may be an alcohol compound of 1 to 10 carbon atoms. The alcohol compound may include, for example, methanol, ethanol, isopropanol, butanol, pentanol, hexanol, heptanol, and/or octanol. The carboxylic acid compound may be a carboxylic acid compound of 1 to 5 carbon atoms. The carboxylic acid compound may include, for example, acetic acid, propionic acid, and/or lactic acid. The acetate compound may be an acetate compound of 1 to 10 carbon atoms. The acetate compound may include, for example, methyl acetate, ethyl acetate, sodium acetate, isopropyl acetate, n-propyl acetate, butyl acetate, n-butyl acetate, isobutyl acetate, vinyl acetate, pentyl acetate, octyl acetate, amyl acetate, and/or 2-ethoxyethyl acetate.

Due to the organic solvent, the etching selectivity of the germanium-containing layer 2100 with respect to the silicon-containing layer 2200 may increase. For example, the organic solvent may protect the silicon-containing layer 2200 to prevent the etching of the silicon-containing layer 2200. The organic solvent may control the rate of forming fluorine anions from a fluorine compound. For example, the organic solvent may prevent excessively rapid dissociation of the fluorine anions from the fluorine compound. Accordingly, the etching selectivity of silicon-germanium with respect to silicon oxide and the etching selectivity of silicon-germanium with respect to silicon may increase.

The organic solvent may be from about 5 wt % to about 15 wt % of the etching composition. If the content of the organic solvent is less than about 5 wt %, the etching selectivity of the germanium-containing layer 2100 with respect to the silicon-containing layer 2200 may decrease. If the content of the organic solvent is greater than about 15 wt %, the content of peracetic acid in the etching composition may decrease, and the etching rate of the germanium-containing layer 2100 may decrease.

The etching composition may further include acetic acid and a remaining content of water. The acetic acid may play a role of easily mixing an organic solvent, a peracetic acid compound, a fluorine compound, an amine compound, and water. For example, the acetic acid may facilitate easier mixing of an organic solvent, a peracetic acid compound, a fluorine compound, an amine compound, and water. The acetic acid may play a role of a pH controller. For example, the etching composition may include acetic acid, and the etching composition may have pH of 1 to 3 during performing an etching process. If the etching process is performed in the above-mentioned pH conditions, the etching selectivity of the germanium-containing layer 2100 with respect to the silicon-containing layer 2200 may be further increased.

Water may include de-ionized water (DIW). Water may be derived from water provided as a solvent during preparing peracetic acid, water provided as the solvent of a fluorine compound, or water included in an organic solvent. During an etching process, a water-soluble product produced by a fluorine compound may be dissolved in water and removed.

The etching composition may further include a surfactant, a metal ion blocking agent, and/or a corrosion inhibitor. The surfactant may include at least one among an anionic surfactant, a cationic surfactant, a nonionic surfactant, and an ampholytic surfactant. The anionic surfactant may include at least one among alkylsulfonic acid, alkylbenzenesulfonic acid, alkylsufonic acid ester, alkyl ether sulfonic acid ester, and/or the salts thereof. The cationic surfactant may include at least one among an amine salt-type surfactant and/or a tetraammonium-type surfactant. The nonionic surfactant may include an alkylene oxide-type surfactant. The ampholytic surfactant may include an amino acid-type surfactant and/or a betaine-type surfactant.

The metal ion blocking agent may include a material containing an amino group, a carboxylic acid group, or a phosphonic acid group. For example, the metal ion blocking agent may include citric acid, ammonium citrate, phosphoric acid, phosphonic acid, etidronic acid, nitrilotris(methylenephosphonic acid), phytic acid, dimethylmethylphosphonate, N,N,N',N'-ethylenetetrakis(methylenephosphonic acid), ethylenediaminetetraacetic acid, cysteine, glycine, glutamine, alanine, and/or glutamic acid.

The corrosion inhibitor may include a heterocycle compound such as triazole, 3-aminotriazole, tetrazole, imidazole, oxazole, 5-aminotetrazole, methyltetrazole, benzimidazole, and/or indazole.

According to embodiments, silicon-germanium may be removed more rapidly than silicon oxide and silicon by using the etching composition. Accordingly, in an etching process using the etching composition, the germanium-containing layer 2100 may have higher etching selectivity than the silicon-containing layer 2200.

Hereinafter, a method for manufacturing a semiconductor device according to the inventive concepts will be explained.

Figure 2:
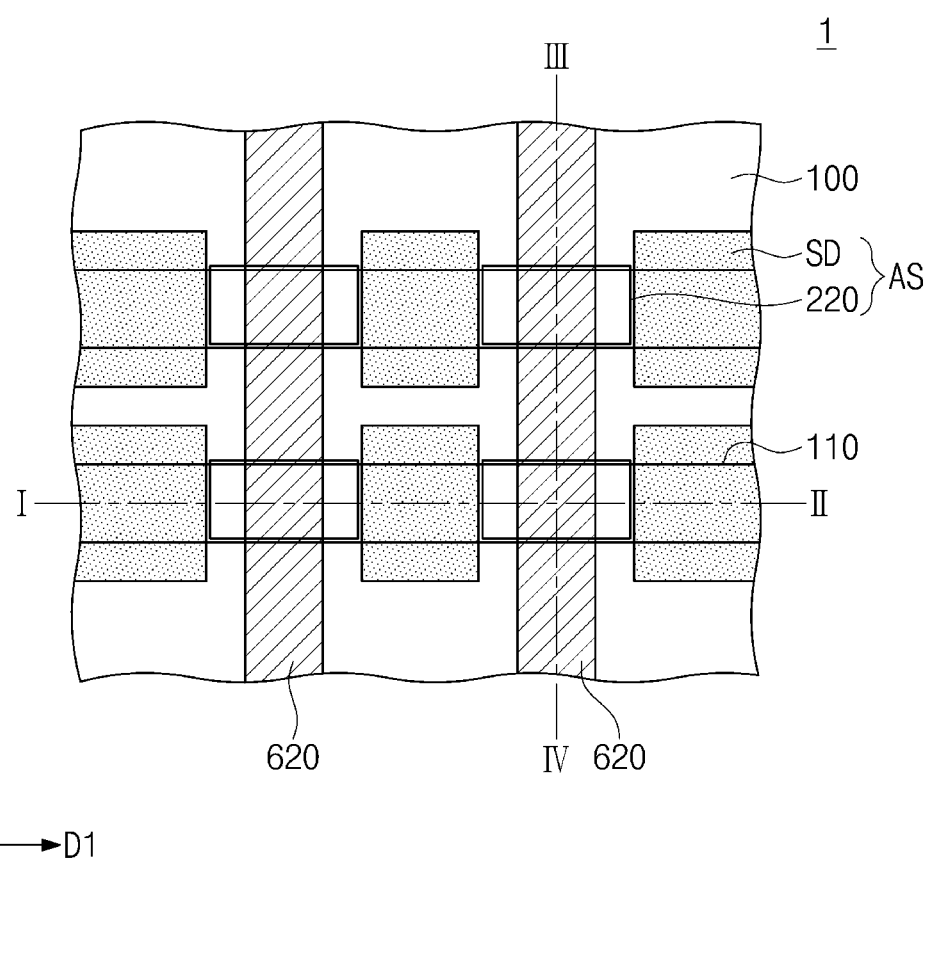
FIG. 2 is a plan view of a semiconductor device according to example embodiments.

FIG. 2 is a plan view of a semiconductor device according to example embodiments. FIGS. 3A to 3H are diagrams for explaining the method for manufacturing a semiconductor device according to example embodiments, and correspond to cross-sectional views cut along lines I-II and III-IV in FIG. 2. Hereinafter, overlapped parts with the above-description will be omitted and will not be repeated.

Figure 3A:
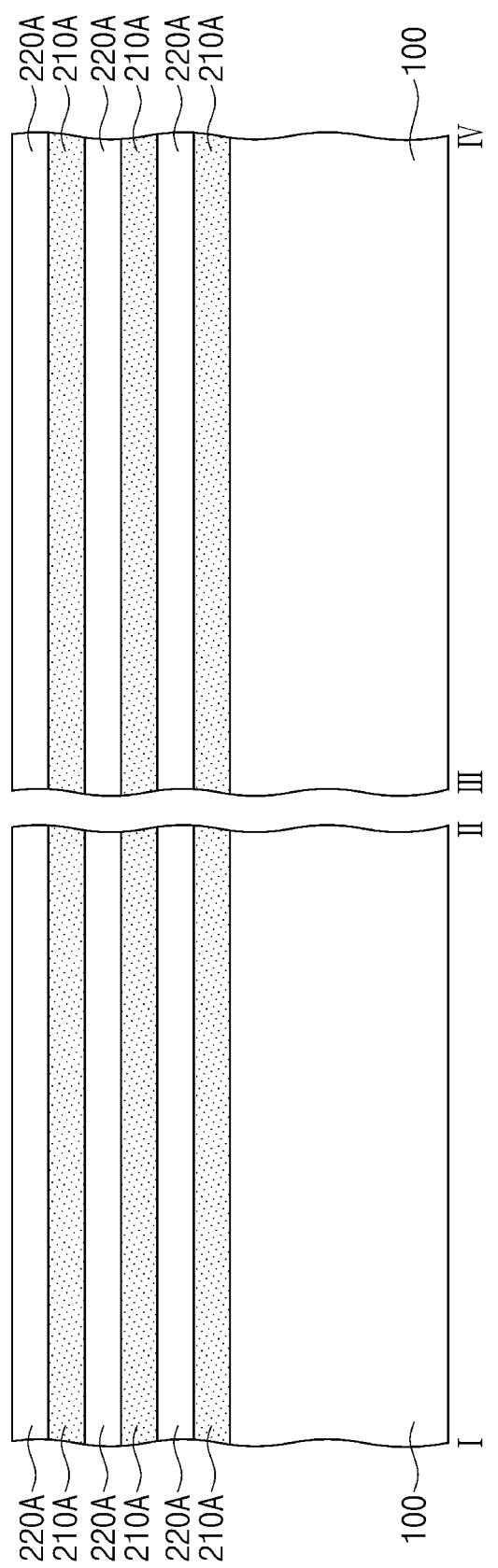
FIGS. 3A to 3H are diagrams for explaining a method for manufacturing a semiconductor device according to example embodiments.

Referring to FIGS. 2 and 3A, first semiconductor layers 210A and second semiconductor layers 220A may be stacked on a substrate 100. The substrate 100 may be a semiconductor substrate. In an embodiment, the substrate 100 may be a silicon substrate or a silicon on insulator (SOI) substrate. The first semiconductor layers 210A and the second semiconductor layers 220A may be formed by performing an epitaxial growth process using the substrate 100 as a seed. The first semiconductor layers 210A and the second semiconductor layers 220A may be alternately stacked on the substrate 100. The number of the first semiconductor layers 210A and the number of the second semiconductor layers 220A may be changed diversely. For example, there may be greater or fewer of the first semiconductor layers 210A and the second semiconductor layers 220A than illustrated. Each of the first semiconductor layers 210A may include a first semiconductor material. The first semiconductor material may be germanium. Each of the first semiconductor layers 210A may further include a second semiconductor material. The second semiconductor material may be silicon. Each of the first semiconductor layers 210A may include the same material as the germanium-containing layer 2100 described referring to FIGS. 1A and 1B. For example, each of the first semiconductor layers 210A may include silicon-germanium. The first semiconductor layers 210A may play a role of sacrificial layers. Each of the second semiconductor layers 220A may include a second semiconductor material. Each of the second semiconductor layers 220A may include the same material as the silicon-containing layer 2200 described referring to FIGS. 1A and 1B. For example, each of the second semiconductor layers 220A may be a silicon layer such as a polysilicon layer.

Figure 3B:
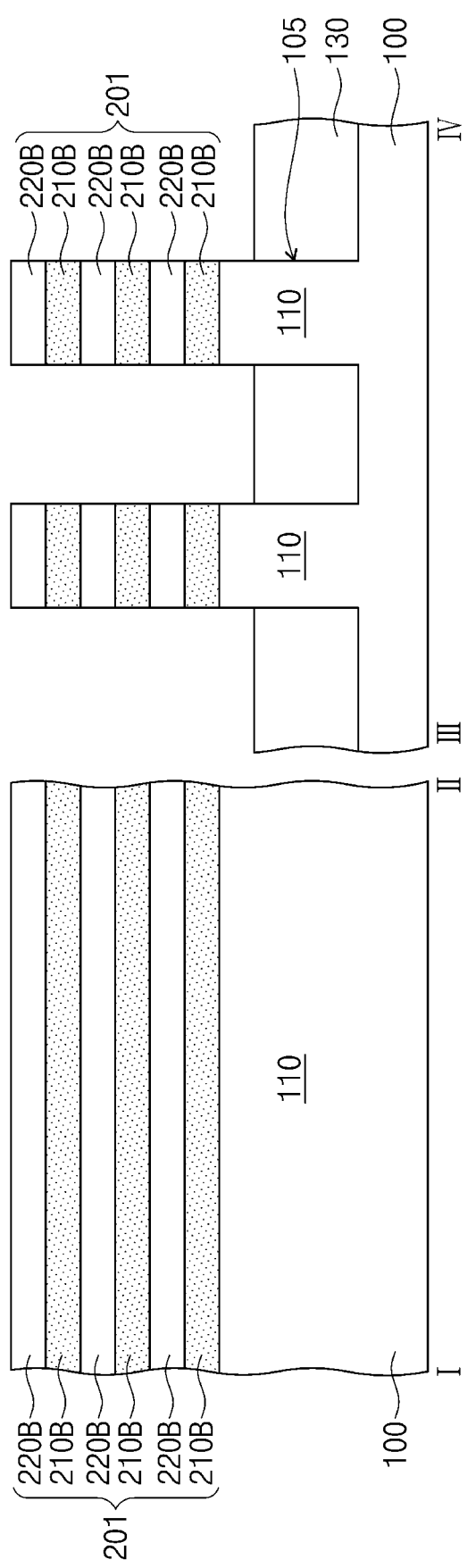

Referring to FIGS. 2 and 3B, a preliminary active pattern 201 and a base active pattern 110 may be formed on a substrate 100. The formation of the preliminary active pattern 201 and the base active pattern 110 may include patterning the first semiconductor layers 210A, the second semiconductor layers 220A, and the upper part of the substrate 100 to form trenches 105. The preliminary active pattern 201 and the base active pattern 110 may be defined by the trenches 105. The trenches 105 may have a line shape extending lengthwise in a first direction D1, and may be separated from each other in a second direction D2. An item, layer, or portion of an item or layer described as extending "lengthwise" in a particular direction has a length in the particular direction and a width perpendicular to that direction, where the length is greater than the width. The first direction D1 may be parallel to the bottom surface of the substrate 100. The second direction D2 may be parallel to the bottom surface of the substrate 100 and substantially orthogonal to the first direction D1. The preliminary active pattern 201 may include first preliminary semiconductor patterns 210B and second preliminary semiconductor patterns 220B. The first preliminary semiconductor patterns 210B may be formed by patterning the first semiconductor layers 210A. The second preliminary semiconductor patterns 220B may be formed by patterning the second semiconductor patterns 220A.

The preliminary active pattern 201 may have a line shape extending lengthwise in the first direction D1. The first preliminary semiconductor patterns 210B and the second preliminary semiconductor patterns 220B may be alternately and repeatedly stacked along an orthogonal direction to the bottom surface of the substrate 100. Each of the first preliminary semiconductor patterns 210B and the second preliminary semiconductor patterns 220B may have a line shape extending lengthwise in the first direction D1. The base active pattern 110 may be formed by patterning the upper part of the substrate 100. The base active pattern 110 may have a line shape extending lengthwise in the first direction D1, and the preliminary active pattern 201 may be formed on the top surface of the base active pattern 110.

Device isolation patterns 130 may be formed to fill each of the trenches 105. The device isolation patterns 130 may be formed on the substrate 100 at both sides of the base active pattern 110. The device isolation patterns 130 may extend lengthwise in the first direction D1. The formation of the device isolation patterns 130 may include forming an insulating layer filling the trenches 105 on the substrate 100, and recessing the insulating layer to expose the side surfaces of the preliminary active pattern 201. The top surfaces of the device isolation patterns 130 may be positioned at a lower level than the top surface of the base active pattern 110. The device isolation patterns 130 may include an oxide, a nitride, and/or an oxynitride. The device isolation patterns 130 may include, for example, silicon oxide.

Figure 3C:
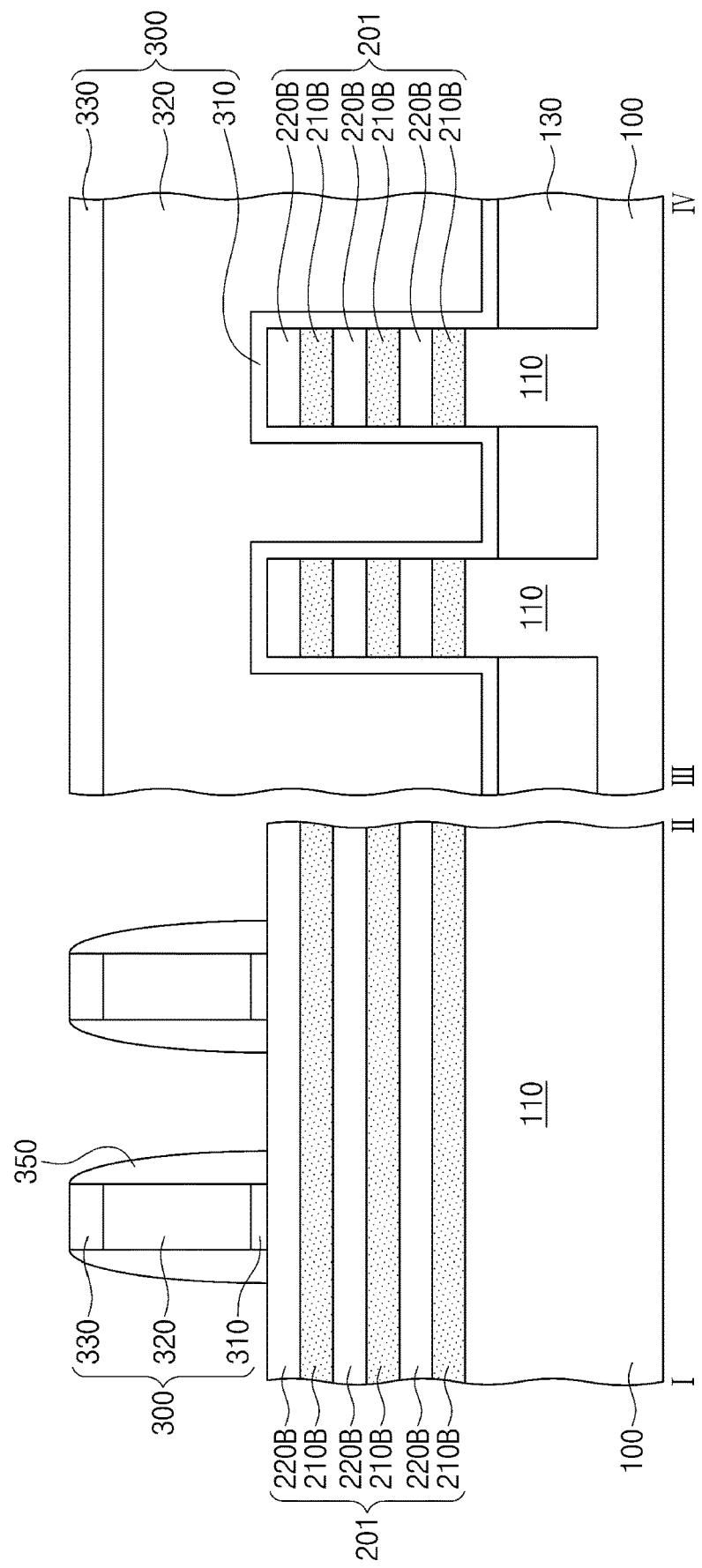

Referring to FIGS. 2 and 3C, a sacrificial gate structure 300 may be formed to cross the preliminary active pattern 201. The sacrificial gate structure 300 may extend lengthwise in the second direction D2 to cross the base active pattern 110 and the device isolation patterns 130. The sacrificial gate structure 300 may include an etch stop pattern 310, a sacrificial gate pattern 320, and a mask pattern 330, which are sequentially stacked. The sacrificial gate pattern 320 may have a line shape extending lengthwise in the second direction D2. The sacrificial gate pattern 320 may cover facing side surfaces of the preliminary active pattern 201 and may cover the top surface of the preliminary active pattern 201 and the top surfaces of the device separation patterns 130. The sacrificial gate pattern 320 may include, for example, polysilicon. The etch stop pattern 310 may be disposed between the sacrificial gate pattern 320 and the preliminary active pattern 201. The etch stop pattern 310 may extend between the sacrificial gate pattern 320 and each device isolation pattern 130. The etch stop pattern 310 may include, for example, a silicon oxide layer. The sacrificial gate pattern 320 may have an etching selectivity with respect to the etch stop pattern 310.

The formation of the sacrificial gate pattern 320 and the etch stop pattern 310 may include forming an etch stop layer (not shown) and a sacrificial gate layer (not shown) one by one, covering the preliminary active pattern 201 and the device isolation patterns 130 on the substrate 100, forming a mask pattern 330 defining a region for forming a sacrificial gate pattern 320 on the sacrificial gate layer, and patterning the sacrificial gate layer and the etch stop layer using the mask pattern 330 as an etching mask. By patterning the sacrificial gate layer using the mask pattern 330 as an etching mask, the sacrificial gate pattern 320 may be formed. After forming the sacrificial gate pattern 320, the etch stop layer at both sides of the sacrificial gate pattern 320 may be removed to locally form the etch stop pattern 310 under the sacrificial gate pattern 320.

Gate spacers 350 may be formed at both sides of the sacrificial gate structure 300 to cover the side walls of the sacrificial gate structure 300. The mask pattern 330 and the gate spacers 350 may include, for example, silicon nitride and/or silicon oxycarbonitride.

Figure 3D:
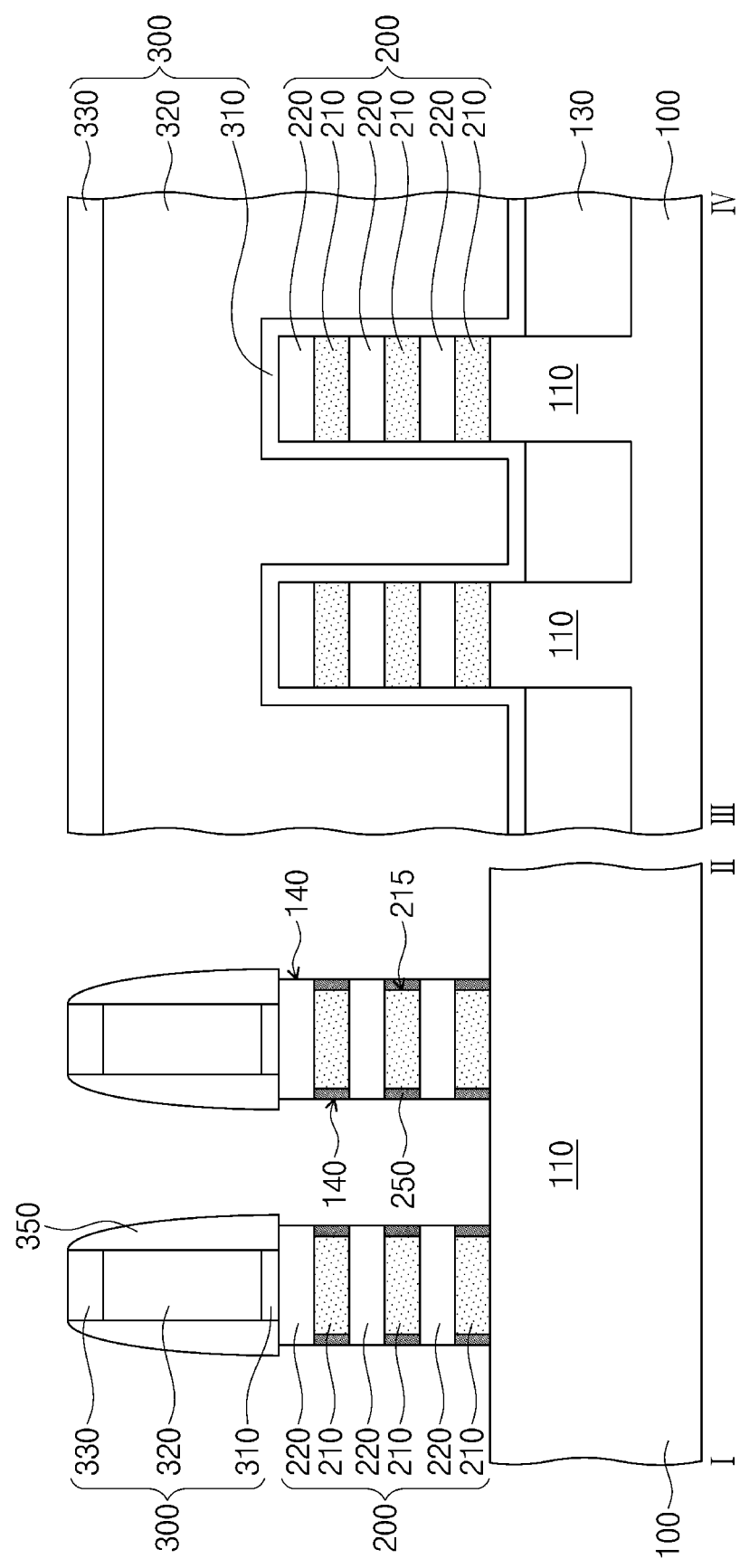

Referring to FIGS. 2 and 3D, the preliminary active pattern 201 may be patterned to form an active pattern 200. The active pattern 200 may be formed under the sacrificial gate structure 300. The formation of the active pattern 200 may include removing the parts of the preliminary active pattern 201 from both sides of the sacrificial gate structure 300. The removal of the parts of the preliminary active pattern 201 may include etching the parts of the preliminary active pattern 201 using the mask pattern 330 and the gate spacers 350 as etching masks. The etching of the parts of the preliminary active pattern 201 may be performed until the top surface of the base active pattern 110 is exposed at both sides of the sacrificial gate structure 300. Accordingly, recess parts 140 defining the active pattern 200 may be formed. The recess parts 140 may be provided at both sides of the sacrificial gate structure 300 and expose the top surface of the base active pattern 110. The active pattern 200 may be formed in plural, and the recess parts 140 may be provided between the active patterns 200. Each active pattern 200 may include the first semiconductor patterns 210 and the second semiconductor patterns 220 stacked on the base active pattern 110. The first semiconductor patterns 210 may be formed by patterning the first preliminary semiconductor patterns 210B. The second semiconductor patterns 220 may be formed by patterning the second preliminary semiconductor patterns 220B.

A portion of the first semiconductor patterns 210 may be further removed in the horizontal direction to form recess regions 215. The recess regions 215 may be formed between the second semiconductor patterns 220, and at the lowermost layer among the second semiconductor patterns 220 and the base active pattern 110. The formation of the recess regions 215 may include performing an etching process using an etching source having an etching selectivity with respect to the first semiconductor patterns 210 on the side walls of the first semiconductor patterns 210.

Insulating spacers 250 may be formed in each of the recess regions 215. The insulating spacers 250 may be formed at both sides of the first semiconductor patterns 210. The formation of the insulating spacers 250 may include conformally forming a barrier insulating layer on the side walls of the active pattern 200 and in the recess region, and performing an anisotropic etching process on the barrier insulating layer. In an embodiment, the insulating spacers 250 may include silicon nitride and/or silicon oxycarbonitride.

Figure 3E:
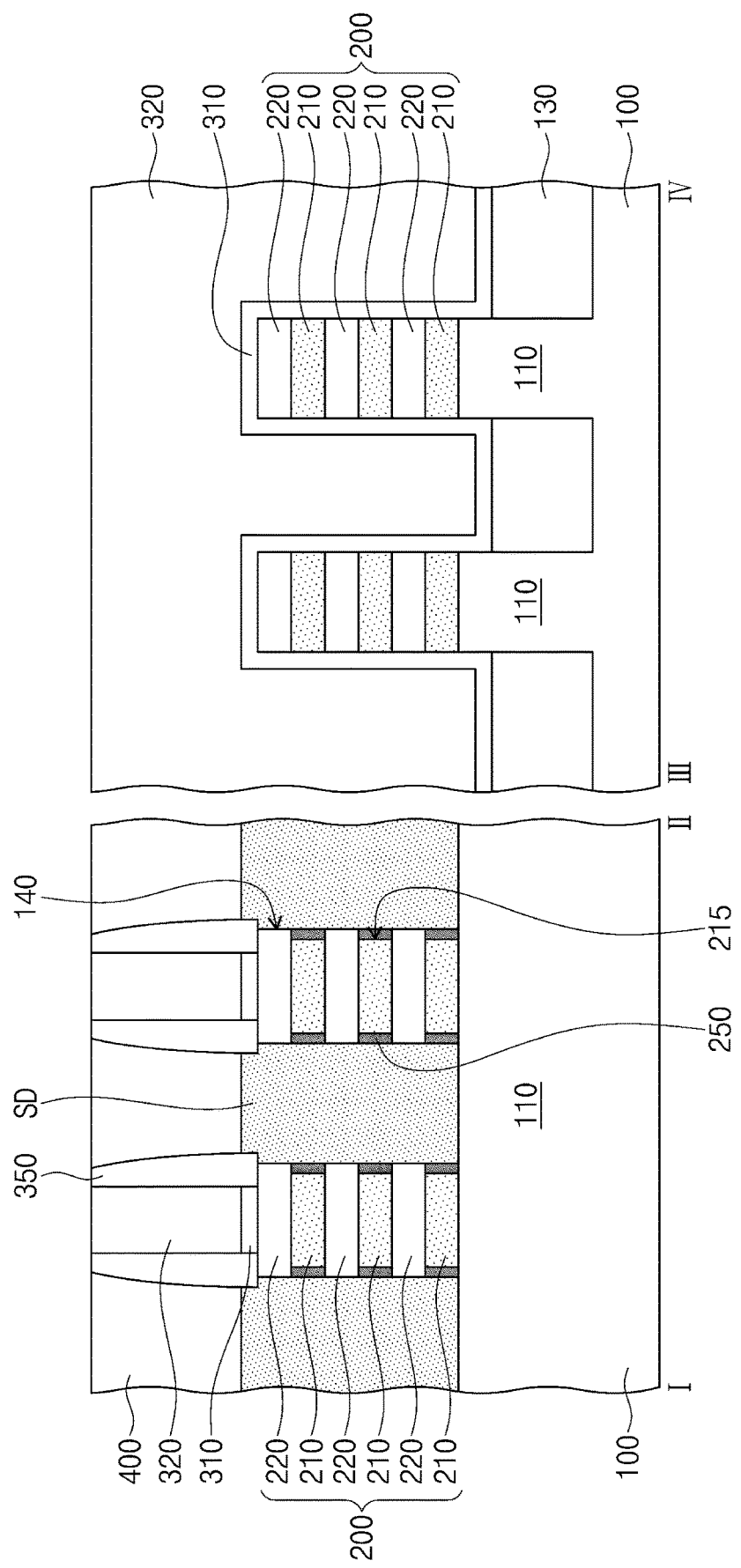

Referring to FIGS. 2 and 3E, source/drain patterns SD may be formed on the base active pattern 110 at both sides of the sacrificial gate structure 300. The source/drain patterns SD may be formed by performing a selective epitaxial growth process using the second semiconductor patterns 220 and the base active pattern 110 as seeds from the recess parts 140. Each of the source/drain patterns SD may be provided in the recess parts 140. Each of the source/drain patterns SD may make physical contact with the exposed side surfaces of the second semiconductor patterns 220 and may make physical contact with the top surface of the base active pattern 110. The source/drain patterns SD may be electrically connected via the second semiconductor patterns 220. The source/drain patterns SD may make physical contact with the insulating spacers 250, respectively. The insulating spacers 250 may be disposed between the source/drain patterns SD and the first semiconductor patterns 210. The source/drain patterns SD may be separated from the first semiconductor patterns 210. For example, the source/drain patterns SD may be separated from the first semiconductor patterns 210 by the insulating spacers 250.

The source/drain patterns SD may include at least one among silicon-germanium (SiGe), silicon (Si), and silicon carbide (SiC). The formation of the source/drain patterns SD may further include doping impurities into the source/drain patterns SD. By the impurity doping, the electrical properties of a transistor including the source/drain patterns SD may be improved. If the transistor is NMOSFET, the impurity may be, for example, phosphor (P), and if the transistor is PMOSFET, the impurity may be, for example, boron (B).

An insulating interlayer 400 may be formed on the substrate 100 to cover the source/drain patterns SD. The formation of the insulating interlayer 400 may include forming an insulating layer covering the source/drain patterns SD and the sacrificial gate structure 300 on the substrate 100, and planarizing the insulating layer until the sacrificial gate pattern 320 is exposed. During the planarization process, the mask pattern 330 may be removed. The insulating interlayer 400 may include at least one among a silicon oxide layer, a silicon nitride layer, a silicon oxynitride layer and low dielectric layers.

Figure 3F:
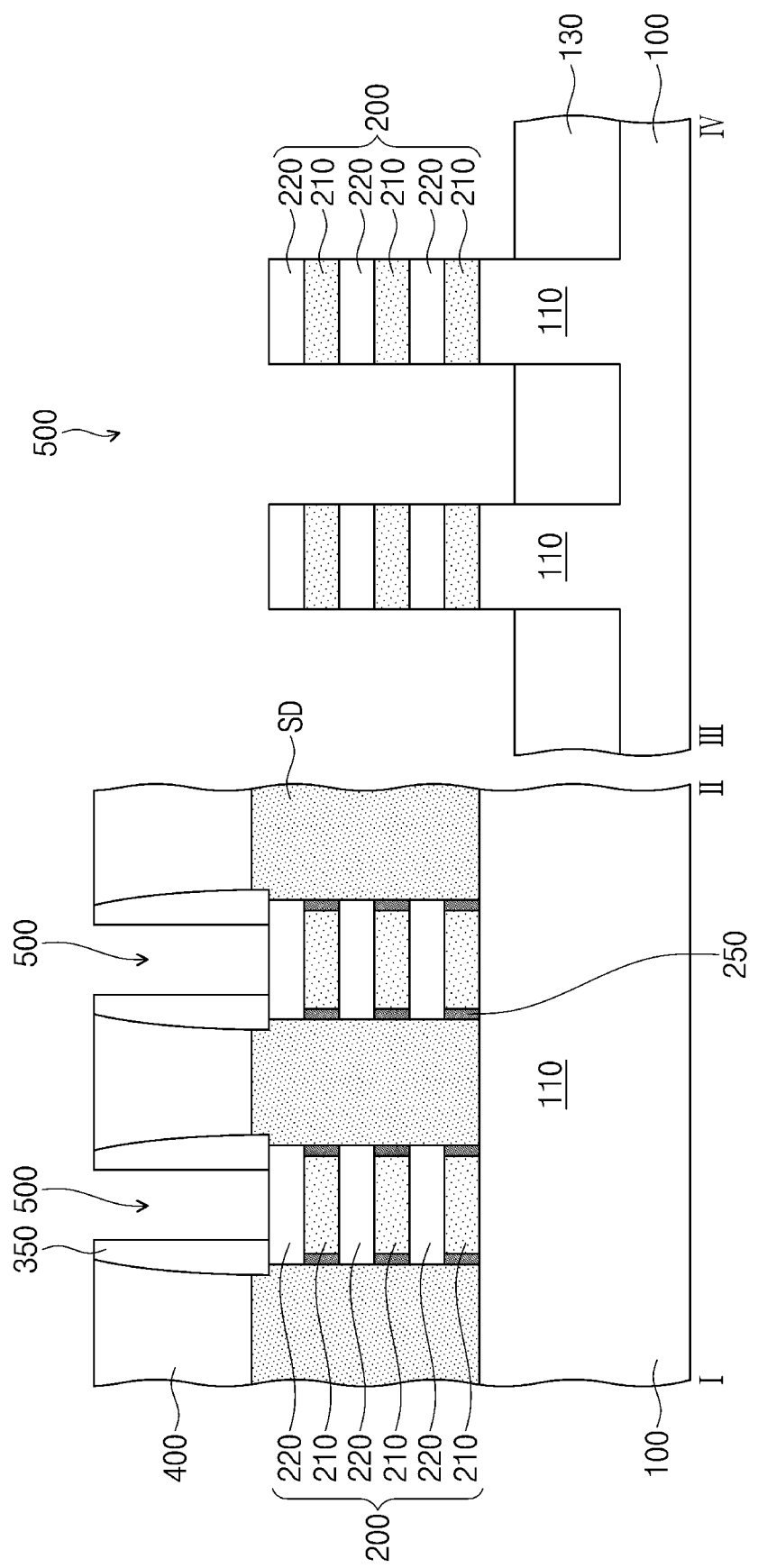

Referring to FIGS. 2 and 3F, the sacrificial gate pattern 320 and the etch stop pattern 310 may be removed to form an opening 500 in the insulating interlayer 400. The opening 500 may expose the active pattern 200 between gate spacers 350. The formation of the opening 500 may include performing an etching process having an etching selectivity with respect to the gate spacers 350, the insulating interlayer 400, and the etch stop pattern 310 to etch the sacrificial gate pattern 320, and removing the etch stop pattern 310. The opening 500 may have a line shape extending lengthwise in the second direction D2, in plan view, and may expose the top surfaces of the device isolation patterns 130. The opening 500 may expose the top surface of the uppermost layer among the second semiconductor patterns 220. The opening 500 may expose the side walls of the second semiconductor patterns 220 and the side walls of the first semiconductor patterns 210.

Figure 3G:
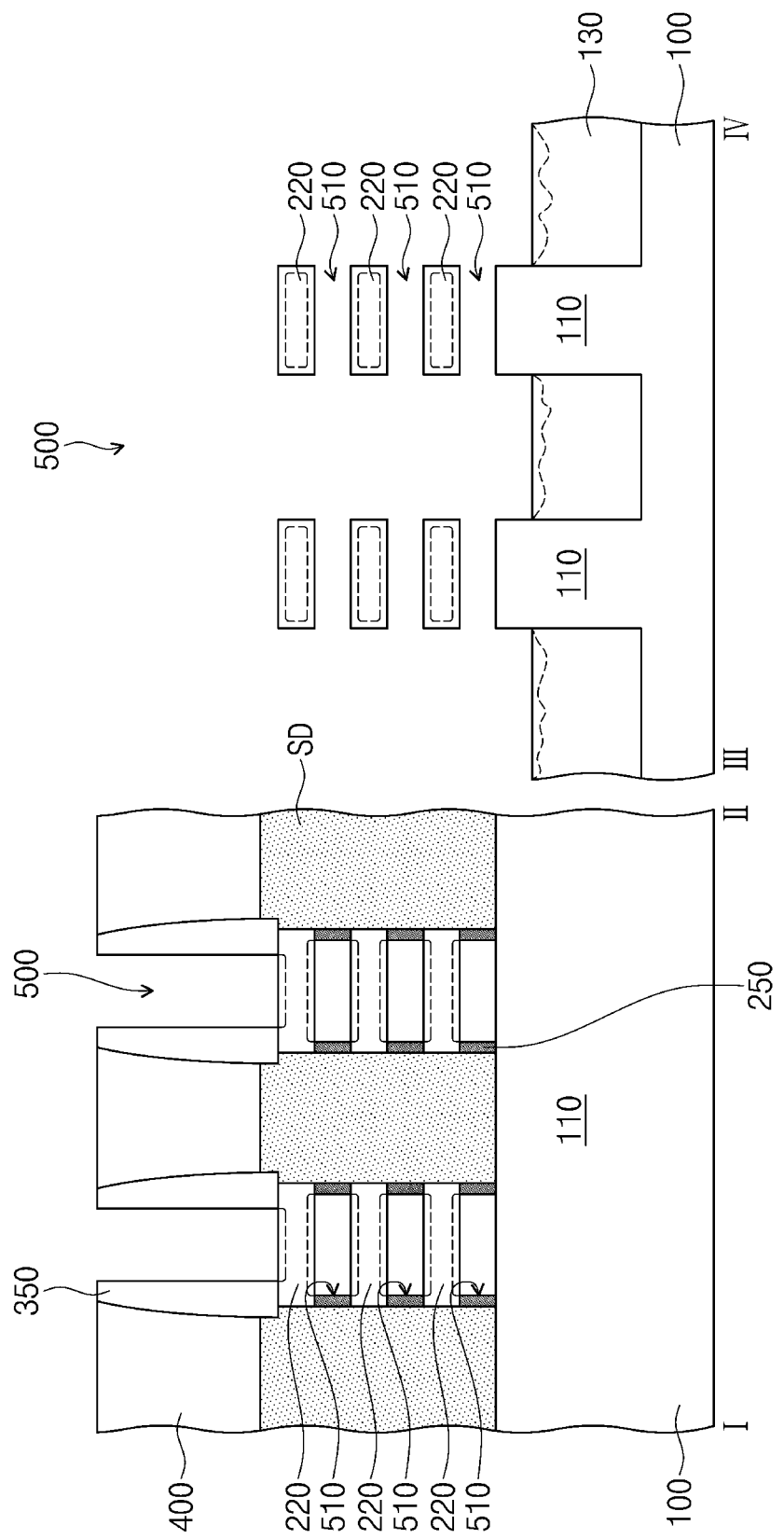

Referring to FIGS. 2 and 3G, the first semiconductor patterns 210 exposed by the opening 500 may be removed by an etching process to form gate regions 510. The gate regions 510 may be formed between the second semiconductor patterns 220 and between the lowermost layer of the second semiconductor patterns 220 and the base active pattern 110. The gate regions 510 may be a vacant region. The gate regions 510 may be connected with the opening 500.

The etching process of the first semiconductor patterns 210 may be performed using the etching composition explained above. The etching process may be performed so that the first semiconductor patterns 210 may have an etching selectivity with respect to the second semiconductor patterns 220. The etching process may be performed by a wet etching process. The etching process may be performed at about 10° C. to about 80° C. In some embodiments, the etching process may be performed at about 15° C. to about 50° C. In this case, the temperature of the etching process may mean the temperature of the etching composition during the etching process.

The etching composition may be the same as explained referring to FIGS. 1A and 1B. According to example embodiments, the etching composition may include peracetic acid, a fluorine compound, an amine compound, and an organic solvent. The etching composition may further include acetic acid. The first semiconductor patterns 210 may include the same material as the germanium-containing layer 2100 as explained with reference to FIGS. 1A and 1B. The first semiconductor patterns 210 may include, for example, silicon-germanium. The first semiconductor patterns 210 may be oxidized by peracetic acid to form silicon oxide and germanium oxide. The amine compound may be adsorbed onto silicon oxide and germanium oxide. The fluorine compound may be dissociated to provide fluorine ions. The silicon oxide and the germanium oxide may react with the fluorine ions to form a water-soluble product. The silicon oxide and the germanium oxide onto which the amine compound is adsorbed may be more easily and quickly react with the fluorine ions. The etching composition may further include water. The water-soluble product may be dissolved in water. Accordingly, silicon-germanium may be removed to etch the first semiconductor patterns 210.

If the etching selectivity of silicon-germanium with respect to silicon is low, a portion of the second semiconductor patterns 220 may be etched during the etching process as shown by the dotted lines. The second semiconductor patterns 220 may play a role of the channel regions of a transistor. According to example embodiments, the etching composition may have high etching selectivity of silicon-germanium with respect to silicon. During the etching process, the etching rate of the first semiconductor patterns 210 may be greater than the etching rate of the second semiconductor patterns 220. During etching the first semiconductor patterns 210, the etching of the second semiconductor patterns 220 may be prevented. The thickness decreasing phenomenon of the channel region of the transistor may be prevented, and the electrical properties of the transistor may be improved.

If the etching selectivity of silicon-germanium with respect to silicon oxide is low in the etching process, as shown by the dotted lines, the top surfaces of the exposed device isolation patterns 130 may be further etched. The etching of the device isolation patterns 130 may be undesired or may have unintended results. According to example embodiments, in the etching process using the etching composition, etching selectivity of silicon-germanium with respect to silicon oxide may be high. Accordingly, the etching phenomenon of the device isolation patterns 130 during the etching process may be prevented.

In the etching process using the etching composition, the etching selectivity of silicon-germanium with respect to silicon nitride or silicon oxycarbonitride may be high. Accordingly, undesired etching of the gate spacers 350 and the insulating spacers 250 may be prevented in the etching process. During the etching process, the source/drain patterns SD may be protected by the insulating interlayer 400 and the gate spacers 350.

Figure 3H:
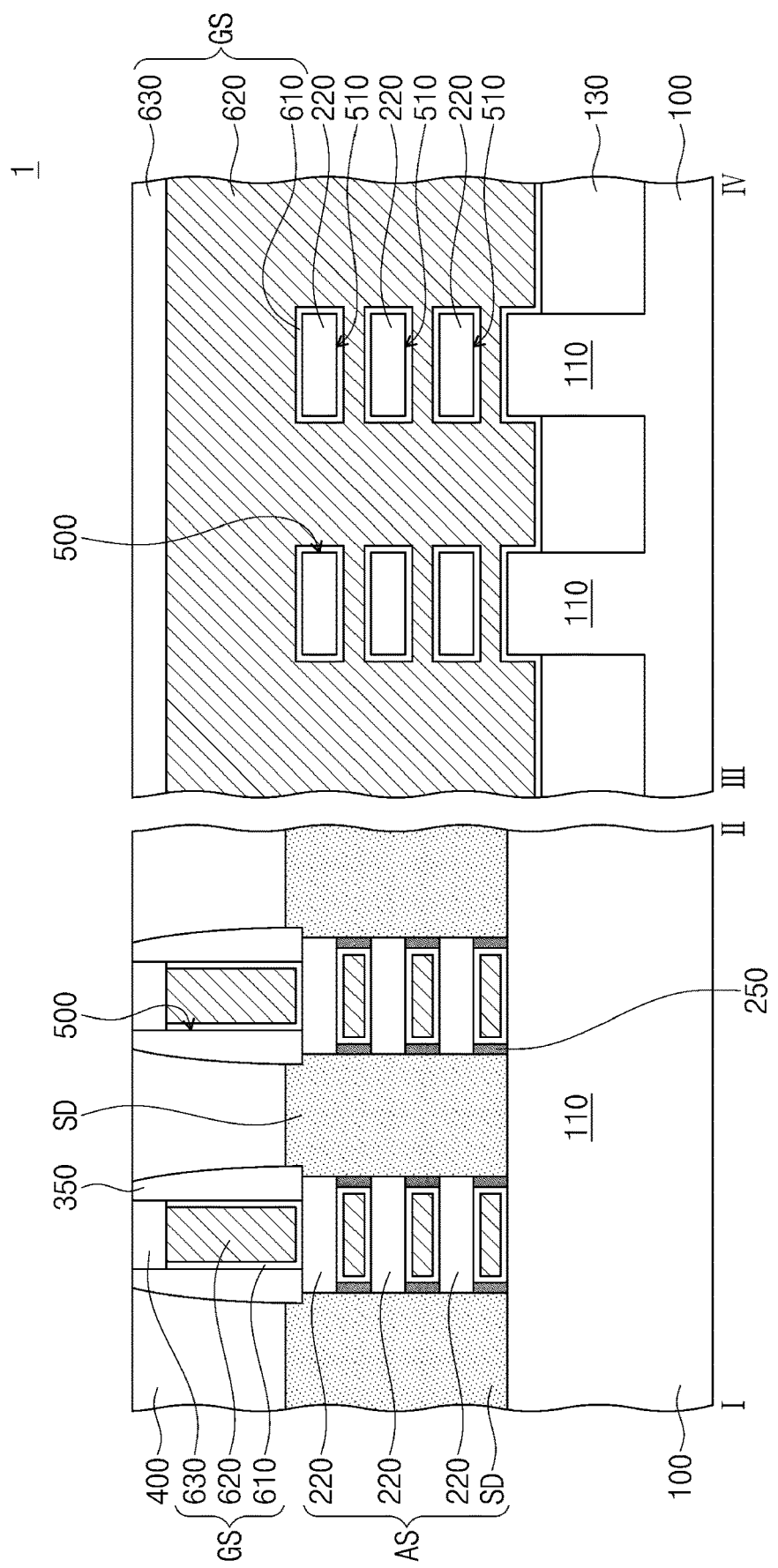

Referring to FIGS. 2 and 3H, a gate structure GS may be formed in the opening 500 and the gate regions 510. The gate structure GS may include a gate insulating pattern 610 and a gate pattern 620. The formation of the gate insulating pattern 610 and the gate pattern 620 may include forming a gate insulating layer which conformally covers the inner surfaces of the opening 500 and the gate regions 510, forming a gate conductive layer which fills the residue of the opening 500 and the gate regions 510, and performing a planarizing process until the insulating interlayer 400 is exposed to locally form the gate insulating pattern 610 and the gate pattern 620 in the opening 500 and the gate regions 510. The gate insulating pattern 610 may include, for example, at least one among a silicon oxide layer, a silicon nitride layer, a silicon oxynitride layer, and a high dielectric layer. The gate pattern 620 may include, for example, at least one among doped semiconductor, a conductive metal nitride, and a metal. The gate pattern 620 may fill the opening 500 and the gate regions 510. The gate pattern 620 may be provided on the gate insulating pattern 610, and may be separated from the second semiconductor patterns 220 and the base active pattern 110. The gate pattern 620 may be separated from the source/drain patterns SD with the gate spacers 350 therebetween.

The gate structure GS may further include a gate capping pattern 630. According to embodiments, the upper parts of the gate insulating pattern 610 and the gate pattern 620 may be recessed, and grooves may be formed between the gate spacers 350. The gate capping pattern 630 may be formed in the groove region. The gate capping pattern 630 may include, for example, at least one among a silicon oxide layer, a silicon nitride layer, and a silicon oxynitride layer.

The second semiconductor patterns 220 may play a role of the channel of a transistor. The second semiconductor patterns 220 may play a role of a bridge channel or a nanowire channel, which connects the source/drain patterns SD. Each of the source/drain patterns SD may make physical contact with the second semiconductor patterns 220. The source/drain patterns SD may be separated from each other in the first direction D1 with the second semiconductor patterns 220 therebetween. The second semiconductor patterns 220 and the source/drain patterns SD may form an active structure AS provided on the base active pattern 110. The active structure AS and the gate pattern 620 may form a gate-all-around-type field effect transistor.

Although not shown, an upper insulating layer may be formed on the insulating interlayer 400. First contact plugs (not shown), penetrating the upper insulating layer and the insulating interlayer 400 and electrically connected to the source/drain patterns SD, and second contact plugs (not shown), penetrating the upper insulating layer and electrically connected to the gate pattern 620, may be formed. On the upper insulating layer, wirings (not shown) connected to the first and second contact plugs may be formed. The first and second contact plugs and the wirings may be formed using a conductive material. According to the manufacturing method described until now, the manufacture of a semiconductor device 1 may be completed. The semiconductor device 1 may be a transistor.

Hereinafter, referring to the experimental examples of the inventive concept and comparative examples, an etching composition and a method for etching using the same will be explained.

[Etching Rate and Etching Selectivity According to the Composition Ratio of Etching Composition]

1. Preparation of Etching Composition

A peracetic acid mixture was prepared by mixing 100 mass percent of an aqueous acetic acid solution, 31 mass percent of an aqueous hydrogen peroxide solution, and an aqueous sulfuric acid solution, in a volume ratio of 33:26:1.

The peracetic acid mixture, a fluorine compound, an amine compound, an organic solvent, and acetic acid were mixed to prepare an etching composition. In this case, hydrofluoric acid was used as the fluorine compound, and octyl acetate was used as the organic solvent. In Experimental Example 1 and Comparative Example 2, 4-picoline was used as the amine compound. As the amine compound of Experimental Example 2, 1,3-diaminopropane was used. As the amine compound of Experimental Example 3, propylamine was used. As the amine compound of Experimental Example 4, 4-methylpiperidine was used. Comparative Example 5 did not include an amine but used 2-mercaptoethanol as a thiol compound.

The etching compositions have the composition ratios shown in Table 1 below. The composition ratio of de-ionized water in Table 1 may be derived from water provided as a solvent during preparing peracetic acid, water provided as the solvent of the fluorine compound, or water included in the organic solvent.

TABLE 1

| | Composition ratio (wt %) | | | | | | |
|---|---|---|---|---|---|---|---|
| | Peracetic acid | Fluorine compound | Amine compound | Thiol compound | Organic solvent | Acetic acid | Water |
| Experimental Example 1 | 45 | 0.5 | 1 | | 10 | 35 | 8.5 |
| Experimental Example 2 | 45 | 0.5 | 0.5 | | 10 | 35 | 9.0 |
| Experimental Example 3 | 40 | 0.6 | 1 | | 8 | 40 | 10.4 |
| Experimental Example 4 | 45 | 0.5 | 1 | | 12 | 35 | 6.5 |
| Comparative Example 1 | 45 | 0.5 | | | 10 | 35 | 9.5 |
| Comparative Example 2 | 45 | 0.5 | 6 | | 10 | 35 | 3.5 |
| Comparative Example 3 | 45 | 0.5 | | | | 35 | 19.5 |
| Comparative Example 4 | 45 | 0.5 | | | | | 54.5 |
| Comparative Example 5 | 45 | 0.5 | | 0.5 | 10 | 35 | 9.0 |
| Comparative Example 6 | 10 | 0.5 | | | 10 | 35 | 44.5 |
| Comparative Example 7 | 80 | 0.2 | | | 10 | 9.8 | 0 |
| Comparative Example 8 | 44.5 | 0.5 | | | 20 | 35 | 0 |

2. Etching Process Using Etching Composition

A first substrate on which a silicon layer was formed is prepared. The silicon layer is a polysilicon layer. A second substrate on which a silicon-germanium layer is formed is prepared.

By using each of the etching compositions of Experimental Examples 1 to 4 and Comparative Examples 1 to 8, the silicon layer and the silicon-germanium layer were etched. The etching of the silicon layer was performed by immersing the first substrate in a vessel containing the etching composition for about 120 seconds. In this case, the temperature of the etching composition was kept to about 25° C. Then, the first substrate was taken out, and the thickness change of the silicon layer was measured. The etching of the silicon-germanium layer was performed by immersing the second substrate in a vessel containing the etching composition of about 25° C. for about 120 seconds. Then, the second substrate was taken out, and the thickness change of the silicon-germanium layer was measured. The measurement of the thickness was performed using a thin film thickness measurement apparatus, and Ellipsometer (NANO VIEW, SE MG-1000) was used as the thin film thickness measurement apparatus. The etching rate of the silicon layer was calculated by calculating the thickness change of the silicon layer according to the etching process time. The etching rate of the silicon-germanium layer was calculated by calculating the thickness change of the silicon-germanium layer according to the etching process time. An etching selectivity was determined as a value obtained by dividing the etching rate of the silicon-germanium layer by the etching rate of the silicon layer.

Table 2 shows the results obtained by evaluating the etching rate and etching selectivity of the silicon layer and the silicon-germanium layer, using the Experimental Examples and the Comparative Examples. The etching selectivity was evaluated by the etching selectivity of a silicon nitride layer with respect to a silicon layer. In the explanation of Table 2, the etching selectivity means the etching selectivity of the silicon-germanium layer with respect to the silicon layer.

TABLE 2

| | Etching rate (Å/min) | | |
|---|---|---|---|
| | Silicon-germanium (SiGe) | Silicon (Si) | Etching selectivity |
| Experimental Example 1 | 562.8 | 5.6 | 100.5 |
| Experimental Example 2 | 519.6 | 4.4 | 118.1 |
| Experimental Example 3 | 668.2 | 5.3 | 122.3 |
| Experimental Example 4 | 530.8 | 4.6 | 115.4 |
| Comparative Example 1 | 303.5 | 3.8 | 79.9 |
| Comparative Example 2 | 767.1 | 14.7 | 52.2 |
| Comparative Example 3 | 270.7 | 10.9 | 24.8 |
| Comparative Example 4 | 199.1 | 8.9 | 22.4 |
| Comparative Example 5 | 249.8 | 3.6 | 69.4 |
| Comparative Example 6 | 23.7 | 0.6 | 39.5 |
| Comparative Example 7 | 195.1 | 8.9 | 21.9 |
| Comparative Example 8 | 269.2 | 4.4 | 61.2 |

Referring to Table 1 and Table 2, in Experimental Examples 1 to 4, the etching rate of the silicon layer was low and the etching rate of the silicon-germanium layer was high. That is, in Experimental Examples 1 to 4, the etching selectivity of the silicon-germanium layer with respect to the silicon layer was high.

For Comparative Example 1, it is considered that since an amine compound was not included, the etching rate of the silicon-germanium layer was low and the etching selectivity was low. For Comparative Example 2, it is considered that since an excessive content (greater than about 5 wt %) of an amine compound was included, the etching selectivity was low.

Comparative Example 5 used a thiol compound instead of an amine compound as an etching booster. Comparative Example 5 had a low etching selectivity. Experimental Examples 1 to 4, using the amine compound as an etching booster had higher etching selectivity than Comparative Example 5. Since the etching compositions according to the Examples used an amine compound as an etching booster, high etching selectivity might be shown.

Comparative Example 6 included a small content (less than about 15 wt %) of peracetic acid, and had low etching selectivity. The etching composition of Comparative Example 6 is considered to have low oxidizing power with respect to the silicon-germanium layer due to the small content of the peracetic acid. If the oxidizing power with respect to the silicon-germanium layer is low, the etching rate with respect to the silicon-germanium layer may be low. Comparative Example 7 is considered to have low etching selectivity due to the excessively large content (for example, greater than about 75 wt %) of the peracetic acid.

Comparative Examples 3 and 4 are considered to have low etching selectivity, because an organic solvent was not included. Comparative Example 8 is considered to have low etching rate of the silicon-germanium layer and low etching selectivity due to the excessively large content (for example, greater than about 15 wt %) of an organic solvent.

[Etching Rate and Etching Selectivity According to the Carbon Number of Amine Compound]

1. Preparation and Evaluation of Etching Composition

A peracetic acid mixture was prepared by mixing 100 mass percent of an aqueous acetic acid solution, 31 mass percent of an aqueous hydrogen peroxide solution, and an aqueous sulfuric acid solution, in a volume ratio of 33:26:1. The peracetic acid mixture, a fluorine compound, an amine compound, an organic solvent, and acetic acid were mixed to prepare an etching composition. Hydrofluoric acid was used as the fluorine compound, and octyl acetate was used as the organic solvent. In this case, diamines of 3, 4, 6, or 8 carbon atoms were used as the amine compound as shown in Table 3 below to prepare each etching composition.

With respect to each etching composition, the etching rate of the silicon-germanium layer was evaluated by the same method explained in Experimental Example 1.

Table 3 shows the results obtained by evaluating the etching rate of the silicon-germanium layer according to the carbon number of the amine compound.

TABLE 3

| Carbon number of amine compound | Etching rate of silicon-germanium (SiGe) (Å/min) |
|---|---|
| 3 | 1133.3 |
| 4 | 922.4 |
| 6 | 754.1 |
| 8 | 714.8 |

Referring to Table 3, the etching composition including an amine compound of 1 to 5 carbon atoms may have higher etching rate of the silicon-germanium layer than the etching composition including an amine compound of 6 or more carbon atoms.

According to the inventive concepts, during an etching process using an etching composition, an etching selectivity with respect to a germanium-containing layer may be high. A semiconductor device manufactured using the etching composition may show improved electrical properties.

Although the exemplary embodiments of the present invention have been described, it is understood that the present invention should not be limited to these exemplary embodiments, but various changes and modifications can be made by one ordinary skilled in the art within the spirit and scope of the present invention as hereinafter claimed.

What is claimed is:

1. An etching composition, comprising:
   a peracetic acid mixture including peracetic acid, acetic acid, and hydrogen peroxide;
   a fluorine compound;
   an amine compound including at least one among an aliphatic amine of 1 to 12 carbon atoms and a cyclic amine of 5 to 12 carbon atoms;
   an organic solvent; and
   wherein the peracetic acid is from about 15 wt % to about 75 wt % of the etching composition and from about 40 wt % to about 60 wt % of the peracetic acid mixture,
   wherein a composition ratio of the organic solvent is from about 5 wt % to about 12 wt %, and
   wherein the amine compound does not include alkanolamine.

2. The etching composition of claim 1, wherein a composition ratio of the amine compound is from about 0.01 wt % to about 5 wt %.

3. The etching composition of claim 1, wherein the organic solvent comprises at least one selected from a carboxylic acid compound of 1 to 5 carbon atoms and an alcohol compound of 1 to 10 carbon atoms.

4. The etching composition of claim 1, wherein the organic solvent comprises an acetate compound of 1 to 10 carbon atoms.

5. The etching composition of claim 1, further comprising water.

6. The etching composition of claim 1, further comprising an aging catalyst, wherein the aging catalyst comprises at least one among sulfuric acid and methanesulfonic acid.

7. An etching composition comprising:
   a peracetic acid mixture including peracetic acid, acetic acid, and hydrogen peroxide;
   a fluorine compound;
   from about 0.01 wt % to about 5 wt % of an amine compound; and
   an organic solvent,
   wherein the peracetic acid is from about 40 wt % to about 60 wt % of the peracetic acid mixture,
   wherein a composition ratio of the organic solvent is from about 5 wt % to about 12 wt %, and
   wherein the amine compound is free of hydroxy group.

8. The etching composition of claim 7,
   wherein a composition ratio of the peracetic acid is from about 15 wt % to about 75 wt %.

9. The etching composition of claim 7, wherein the amine compound comprises at least one among an aliphatic amine of 1 to 12 carbon atoms and a cyclic amine of 5 to 12 carbon atoms.

10. The etching composition of claim 7, wherein the organic solvent comprises an acetate compound of 1 to 10 carbon atoms.

11. The etching composition of claim 7, further comprising water.

12. The etching composition of claim 7,
wherein the organic solvent comprises at least one among an alcohol compound of 1 to 10 carbon atoms and a carboxylic acid compound of 1 to 5 carbon atoms,
wherein a composition ratio of the fluorine compound is from about 0.01 wt % to about 5 wt %, and
wherein the fluorine compound comprises at least one among hydrofluoric acid (HF), sodium fluoride (NaF), potassium fluoride (KF), aluminum fluoride ($AlF_2$), lithium fluoride ($LiF_4$), calcium fluoride ($CaF_3$), sodium hydrogen hexafluoride ($NaHF_6$), ammonium fluoride ($NH_4F$), ammonium difluoride (NH4$HF_2$), tetramethylammonium fluoride (($CH_3)_4NF$), potassium bifluoride ($KHF_2$), tetrafluoroboric acid ($HBF_4$), ammonium tetrafluoroborate ($NH_4BF_4$), potassium fluoroborate ($KBF_4$), and fluorosilicic acid ($H_2SiF_6$).

13. An etching composition, comprising:
a peracetic acid mixture including peracetic acid, acetic acid, and hydrogen peroxide;
from about 0.01 wt % to about 5 wt % of a fluorine compound;
from about 0.01 wt % to about 5 wt % of an amine compound;
from about 5 wt % to about 12 wt % of an organic solvent; and
an aging catalyst comprising at least one among sulfuric acid and methanesulfonic acid,
wherein the peracetic acid is from about 15 wt % to about 75 wt % of the etching composition and from about 40 wt % to about 60 wt % of the peracetic acid mixture,
wherein the organic solvent comprises an acetate compound of 1 to 10 carbon atoms,
wherein the amine compound comprises at least one among an aliphatic amine of 1 to 12 carbon atoms and a cyclic amine of 5 to 12 carbon atoms, and
wherein the amine compound does not include hydroxyl group.

14. The etching composition of claim 13,
wherein the fluorine compound is hydrofluoric acid,
wherein the amine compound is one of the 4-picoline, 1,3-diaminopropane, propylamine, and 4,4-methylpiperidine, and
wherein the organic solvent is octyl acetate.

15. The etching composition of claim 1,
wherein the amine compound is one of the 4-picoline, 1,3-diaminopropane, propylamine, and 4,4-methylpiperidine.

* * * * *